United States Patent [19]

McGroddy

[11] 3,996,492

[45] Dec. 7, 1976

[54] TWO-DIMENSIONAL INTEGRATED INJECTION LASER ARRAY

[75] Inventor: James Cleary McGroddy, Putnam Valley, N.Y.

[73] Assignee: International Business Machines Corporation, Armonk, N.Y.

[22] Filed: May 28, 1975

[21] Appl. No.: 581,454

[52] U.S. Cl. .............................. 313/500; 313/114; 357/17

[51] Int. Cl.² ........................................ H01L 33/00

[58] Field of Search ................. 313/114, 499, 500; 357/17

[56] References Cited

UNITED STATES PATENTS

| | | | |
|---|---|---|---|
| 3,290,539 | 12/1966 | Lamorte | 313/114 |
| 3,302,051 | 1/1967 | Galginaitis | 357/17 |
| 3,443,140 | 5/1969 | Ing, Jr. et al | 357/17 |
| 3,500,135 | 3/1970 | Li | 313/499 |
| 3,555,335 | 1/1971 | Johnson | 313/500 |
| 3,821,775 | 6/1974 | Biard | 357/17 |

*Primary Examiner*—John Kominski
*Attorney, Agent, or Firm*—George Baron; Robert E. Sandt

[57] ABSTRACT

An injection laser, whose sides are chemically etched to produce facing 45° mirrors, can be made to emit lasing light in the same direction as current going through the p-n junction. A two dimensional array of lasers is produced wherein the location of each laser is uniformly spaced from an adjacent laser.

5 Claims, 7 Drawing Figures

TWO-DIMENSIONAL INTEGRATED INJECTION LASER ARRAY

BACKGROUND OF THE INVENTION

In the usual structure of an injection laser, current is sent across a p-n junction of two dissimilar type semiconducting layers to produce a nonequilibrium concentration of holes and electrons in a common recombination region. When these generated holes and electrons recombine, light is emitted in the region of the p-n junction. When operated as a laser with a Fabry-Perot cavity, the light is emitted along the length of the junction in a plane that is perpendicular to the direction of current flow through the junction.

It is desirable to alter or modify the geometry of light production across the above noted junction so that the light produced by the recombination of holes and electrons will be emitted in a direction that is perpendicular to the p-n junction plane. Such light direction output will enable one to construct a two dimensional array of injection lasers. Previous efforts to make an array of planar p-n junction laser light sources required auxiliary equipment independent of the light source or a complex grating feedback and coupling scheme. A representative array is the invention to M. F. Lamorte, U.S. Pat. No. 3,290,539 which issued on Dec. 6, 1966 on an application filed Sept. 16, 1963. However, in the Lamorte structure, a sheet of a light reflecting material, such as aluminum, is punched with a plurality of holes, each hole being shaped to serve as a parabolic reflector. This sheet, containing the plurality of light reflectors, is positioned over an array of p-n junction lasers so as to reflect the light from each junction in a direction perpendicular to the plane of that junction. However, such punched out sheet of aluminum is separate from each p-n junction laser and one is faced with the problem of positioning each fixed reflector over each fixed p-n junction, yet attain uniform light emission from each laser.

Complex injection laser structures using diffraction gratings for feedback and coupling the light out in a direction parallel to the current flow have been described by Comerford and Zory and others; for example, see an article entitled "Selectively Etched Diffraction Gratings in GaAs" published in Applied Physics Letters, Volume 25, page 208, 1974 and bibliography therein.

The present invention achieves an array of p-n junction lasers by chemically etching opposing sides or walls of a plurality of p-n junctions, deposited, by conventional lithographic techniques, whereby the etchant chosen preferentially cuts away such walls at an angle of approximately 45° to the plane of a p-n junction. Such 45° angled walls serve as mirrors that reflect the lasing light of the p-n junction in the direction of electrical current flow through the junction. Not only are these 45° mirrors part of the optical cavity of the p-n junction laser, but they are integral with the laser, per se, and, as such, serve to achieve an array of lasers wherein the alignment problems are minimized.

Thus, it is an object of this invention to attain a folded cavity effect for each injection laser of an array of lasers so as to permit lasing light to emanate from a p-n junction laser perpendicularly to the plane of that p-n junction.

It is yet another object to change the geometry of an injection laser so that the means for modifying the direction of light output from that junction laser is integral with that laser.

A further object is to provide a novel two dimensional laser array wherein the method of manufacturing the array achieves uniformity of performance of each laser in that array.

DESCRIPTION OF THE DRAWINGS

FIG. 1 is an illustration of a representative double heterojunction injection laser array of the prior art that is essentially one dimensional. On a layer 2 of n-type GaAs are grown consecutive layers of n-type GaAlAs 4, p-type GaAs 6, p-type GaAlAs 8 and p-type GaAs 9. Metal electrodes 10 in the form of strips are deposited, through conventional lithography techniques, onto the top layer 9. A metal layer 12 is deposited on the bottom of the entire epitaxially grown unit. The planar mirror facets P and P' are formed by cleaving the crystalline structure along (110) planes. When current above a threshold value from a battery 14 is sent through a selected electrode 10, light L emanates from the facet on the p-n junction 16, such p-n junction lying in a plane that is perpendicular to the direction of current flow from electrode 10 to electrode 12. That is, the cavity of the laser structure is bounded by the two cleaved facets P and P', and the laser light is emitted from the facets, in a direction approximately perpendicular to the direction of current flow. The necessary reflectivity at the cavity facets is provided by the discontinuity of the index of refraction between the semiconducting materials and air.

Figure 1:
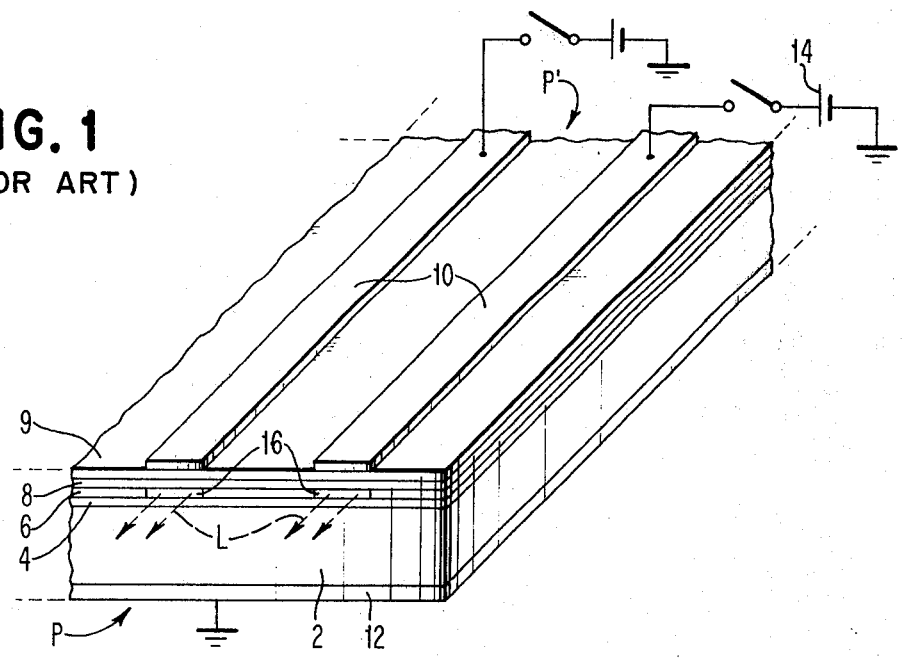
FIG. 1 is a showing of the lasing of a prior art injection laser array.

It would be highly desirable to modify the prior art structure of FIG. 1 so as to make it serve as a two dimensional array of lasers and in effect to square the capacity of the unit of the prior art. This is achieved by effectively folding the optical cavity of the device of FIG. 1, using a chemical etchant to make 45° cuts in planes P and P'. A reference to FIG. 2 will illustrate how such "folding" of the optical cavity is attained.

The thickest portion of the novel fabricated two dimensional laser array is the first layer 20 of n-type GaAs which is about 100 microns thick. Above the n-type GaAs 20 is grown an n-type layer 22 of $Ga_{0.7}Al_{0.3}As$ which can be about 4-5 microns thick. Above layer 22 is grown a 0.3 micron layer 24 of p-type GaAs so as to form the p-n junction 25. Two final thin layers are grown successively above layer 24, namely, a 1 micron layer 26 of p-type $Ga_{0.7}Al_{0.3}As$ and a 1 micron layer 28 of p-type GaAs.

Figure 3:
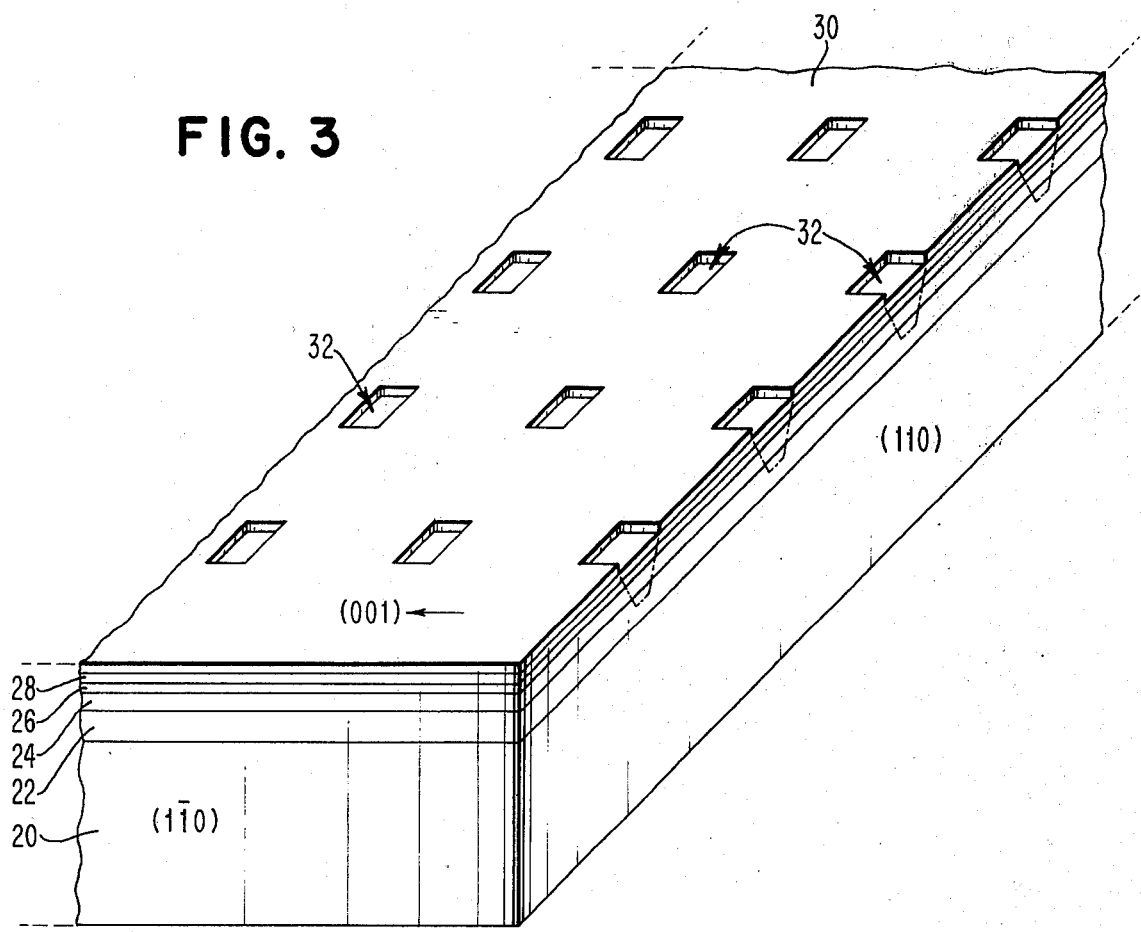
FIG. 3 is a drawing for enhancing the understanding of the method used for making the invention of FIG. 2.

In order to attain a cavity feedback effect, photoresist or $SiO_2$ strips 30 (See FIG. 3) are deposited over the top layer 28, leaving spaces or windows 32 that are 10–12 microns wide. These windows are chemically etched to a depth of 5–6 microns, producing channeled grooves 34, using a solution of $H_2SO_4$—$H_2O_2$—$H_2O$.

Figure 2:
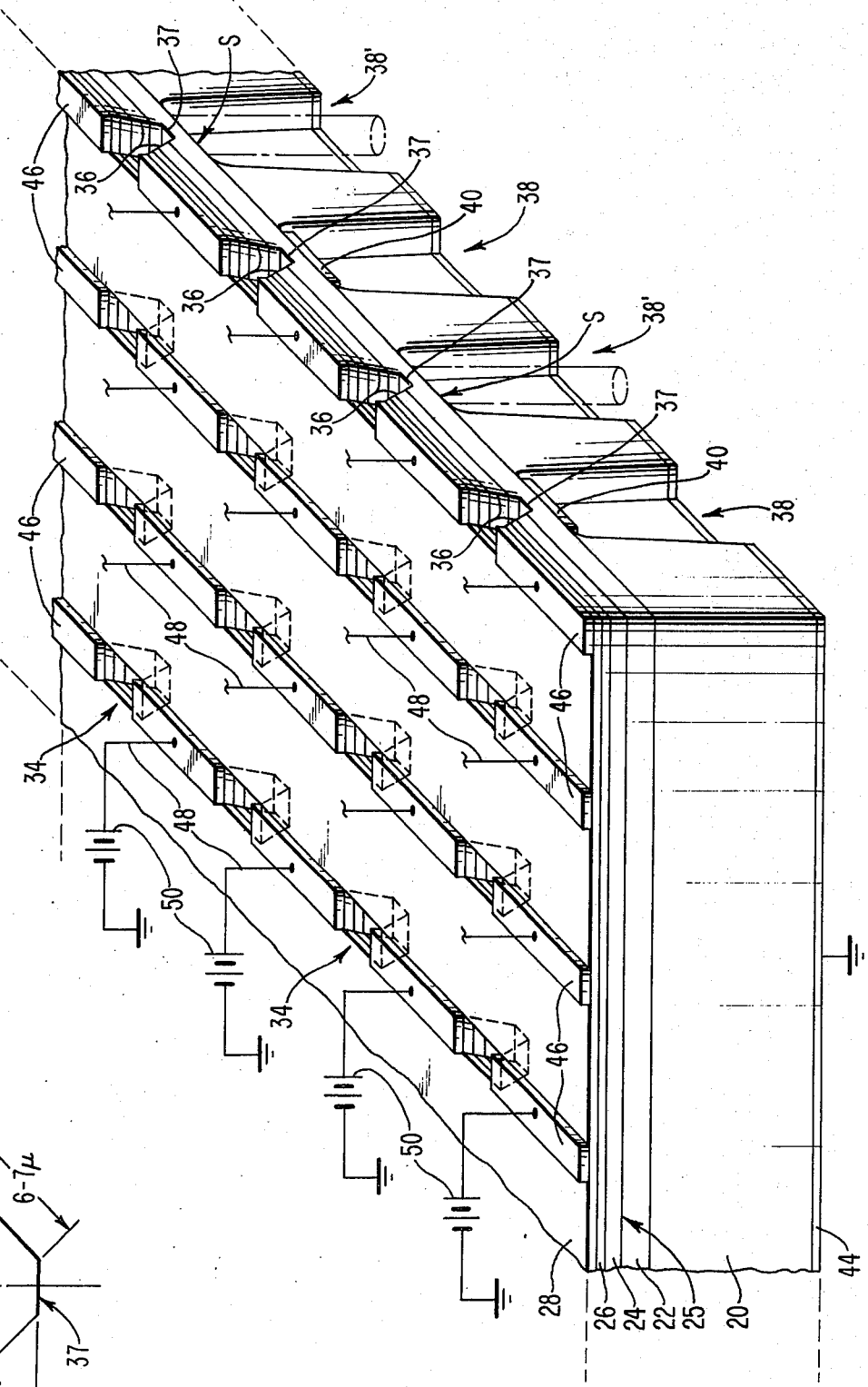
FIG. 2 is a schematic showing of a preferred embodiment of applicant's laser array.

The exact details of a successful etchant for producing the 45° angle $\theta$ shown in FIG. 2 are described in a paper entitled "Selective Etching of Gallium Arsenide Crystals in $H_2SO_4$—$H_2O_2$—$H_2O$ System" by Shina Iida et al, published in the Journal Electrochemical Society; Solid State Science, May 1971, pp. 768-771. Two examples of etchants that will produce a 45° angle are solutions of (a) $1H_2SO_4$—$8H_2O_2$—$1H_2O$ and (b) $8H_2SO_4$—$1H_2O_2$—$H_2O$. In the examples chosen, the concentration of $H_2SO_4$ is a 98% solution by weight and the concentration of $H_2O_2$ is a 30% solution by weight whereas the formula concentrations are by volume. In an actual run, the (a) solution noted above, when cooled to 0° C, was able to etch through the GaAs layers at a rate of 3-4 microns per minute. The etch was found to produce a 45° angle channel when the etch was performed on the surface oriented in the (001) direction and the mutually rectangular planes are (1$\bar{1}$0) and (110) with the etching taking place into the (001) plane. The etching solution is quenched as soon as the desired amount of etching has taken place.

Obviously, the rates of etching can be changed by increasing the temperature of the etchant and the etchant is selective according to the crystal orientation of the material. As is disclosed in the above cited Iida et al article, the 45° etch produces a mirror-like surface, so that an edge, such as edge 36 of channel 34 serves as a mirror for the light emanating from p-n junction 24. The etching stops along line 37 in layer 22. This laser light is totally reflected so that after reflection it is propagated in a direction perpendicular to the layers.

Figure 4:
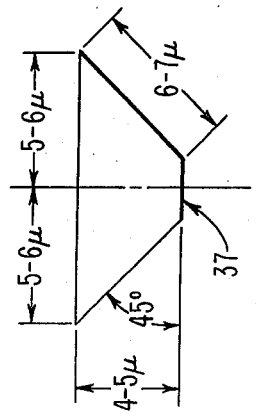
FIG. 4 is a drawing illustrating the geometrical relationships of parts of the laser after chemical etching has taken place.

As seen in FIG. 4, the geometry of etching is such that when a window 32 has a width of 10-12 microns, the depth of etch is 4 to 5 microns and the length of the channel edge 36 varies from 7 to 8 microns, with that edge 36 making an angle of 45° with the p-n junction plane. Such edge 36, when etched, is 100% reflective for light propagating in the p-n junction.

To complete the fabrication of the array, the GaAs substrate 20 is etched upwardly from its bottom surface, through a hole in a photoresist mask, using a solution of $1H_2SO_4$—$8H_2O_2$—$1H_2O$ at 0° C for a time between 4-5 minutes, after which the etchant is quenched. Such etching removes entirely the layer 20 of GaAs under the hole in the photoresist mask, exposing the planar lower surface of GaAlAs layer 2 so as to produce a window 38. A 2000-3000A layer of gold or other reflecting material 40 is deposited over layer 22 and such layer 40 can serve as a totally reflecting layer. In the adjacent window 38', no layer is deposited beneath the etched sides 36 because this interface S, per se, serves as a partially transmissive mirror. The mirrors are deposited alternately, in one window 38 but not in its adjacent window 38', so that one is totally reflecting and its adjacent unmirrored one is partially transmissive, for reasons that will be obvious soon hereafter. A thin layer of metal 44 is deposited on the bottom surface of n-type GaAs 20 and an array of conductors 46 are deposited, through appropriate masks (not shown), each of said conductors 46 serving as an electrode for a given injection laser. Suitable leads 48 are attached to each of said electrodes 46 and connect to a source of power 50.

When threshold current is sent through a given electrode 46, the light normally being guided by the heterojunction structure 22, 24 and 26 will impinge on facing mirrors 36, causing the emitted light to be reflected downwardly. Mirror 40 and etched surface S serve as reflectors and ends of an optical cavity. One mirror 40 serves as the fully reflecting mirror for two adjacent edges of two separate lasers (the right edge of a first laser and the left edge of a second laser adjacent the first laser). The etched surface S serves as a partially transmitting mirror for two adjacent lasers (the right edge of the second laser and the left edge of a third laser adjacent the second laser). In this way, a planar mirror 40 or surface S serve as part of the optical cavity of two independent adjacent lasers. In some cases it may be desirable to fabricate the array with individual mirrors for each cavity so that no single mirror serves two separate cavities.

Figure 2A:
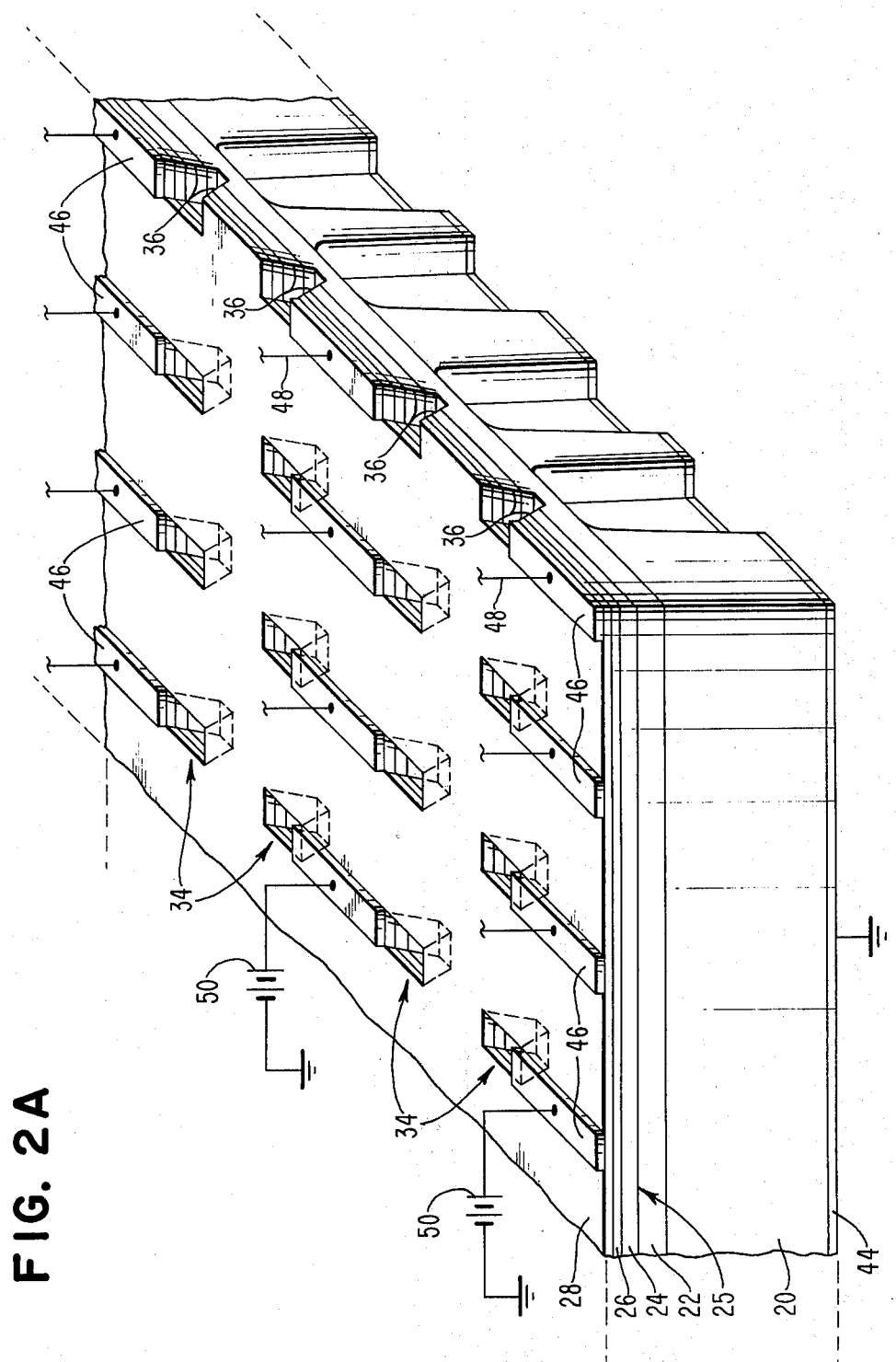
FIG. 2A is a modification of the invention of FIG. 2.
Figure 5:
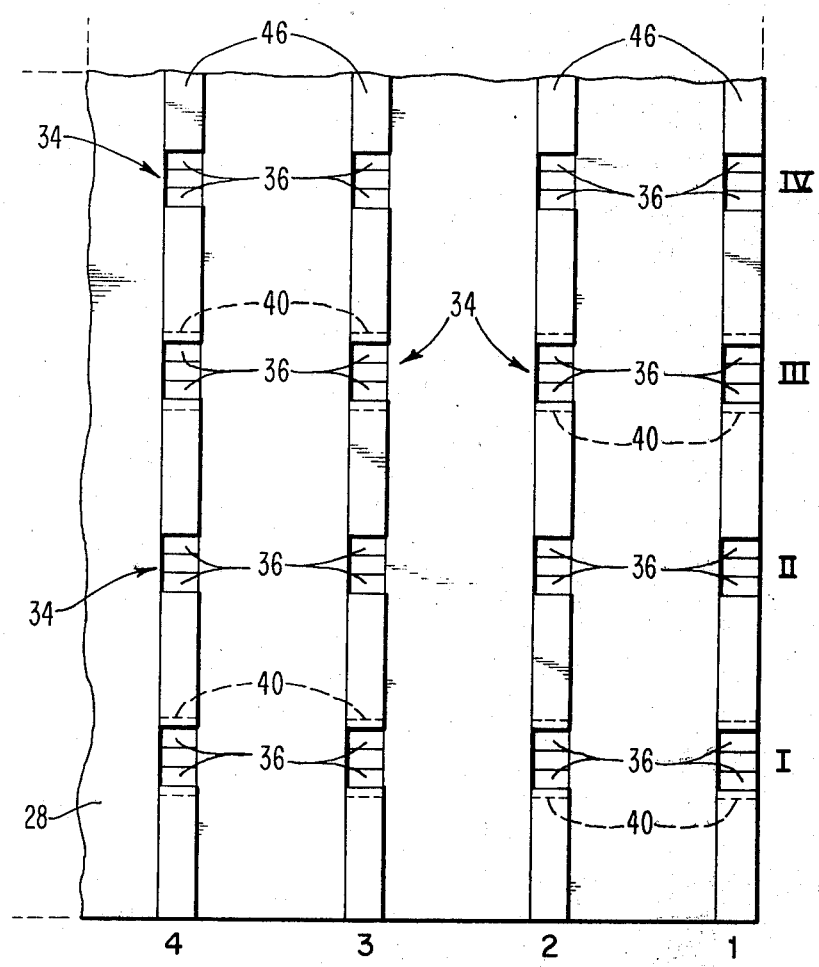
FIG. 5 is a top view of the laser array of FIG. 2.

FIG. 5 is a view of the laser array as seen from the top of FIG. 2A. Each of the channels 34 has two edges 36. Conductive strips 46 are each the top electrode of a laser formed between two facing edges 36 that were produced by chemical etching, i.e., between a pair of channels 34. If the totally reflecting mirror 40 (see FIG. 2) is beneath column I of FIG. 5, then there will be no light emitted from this column of windows. An adjacent mirror-like etched surface S will be partially transmissive of the lasing light and such surface S will permit light to be emitted from windows lying in column II. Thus, there will be alternate emission in column II and IV, but mo emission in columns I and III. Light emitted at window II-I can come from either of two adjacent lasers, depending on whether current is applied to the respective contacts 46.

Figure 6:
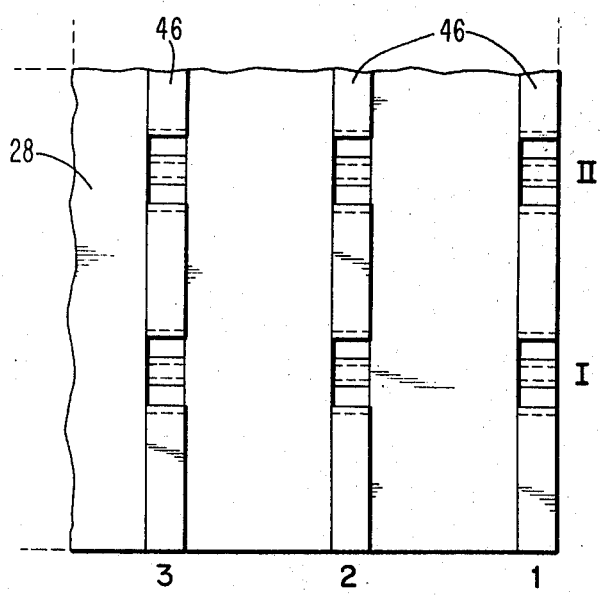
FIG. 6 is a variation of the invention set out in FIG. 5.

The embodiment of the invention of FIG. 2 wherein total separation of the lasers is achieved is set out in FIG. 6. Rather than have an individual reflecting region 40 or surface S serve two adjacent lasers, etching can take place for long enough periods so that all edges 36 cut through into layer 20 and are separated from each other (See FIG. 2). In this way individual mirrors 40 are used under each edge 36, permitting each laser to be operated separated from its adjacent laser.

It should be noted that the etching of bottom layer 20 through a circular mask provides a channel suitable for accommodating a light pipe, or optical fiber, shown in phantom, to conduct light away from each laser.

The ability to etch a mirror-like 45° surface on GaAs now enables one to make injection lasers so that the light emanating from the p-n junction is in a direction that is parallel to the direction of current flow through the junction. This latter capability makes it possible to construct two dimensional arrays of p-n junction lasers. Moreover, the method of achieving the folded cavity effect that enables one to make a two dimensional array of p-n junctions does not require any auxiliary equipment which would entail alignment problems. The etched wall 36 inherently has the correct angular orientation as well as high reflectivity so that the very nature of fabricating the array enhances the precision of locating each laser in that array.

It is to be understood, where the absorption of the n-type GaAs layer 20 of the laser light being produced is not so high as to impair the operation of the array, then windows 38, 38', etc. need not be etched and the common electrode 44 can cover the entire bottom surface of layer 20.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A folded cavity injection laser system comprising an array of p-n junctions in a supporting body,
   electrodes electrically coupled to said p-n junctions whereby current through said electrodes produces light emission across said p-n junctions in a plane that is perpendicular to the direction of current flow through said junctions,
   chemically etched mirror-like surfaces on said body, said etched surfaces being disposed at opposite ends of and at a 45 degree angle to each of said p-n junctions so that lasing light is reflected in a direction parallel to said current direction in a p-n junction,
   a totally reflecting thin film mirror beneath one of said pair of etched surfaces, and
   a partially transmissive mirror beneath the other of said pair of etched surfaces.

2. An array of p-n junction lasers comprising a first layer of n-type GaAs,
   a second layer of n-type $Ga_{0.7}Al_{0.3}As$ on said first layer,
   a third layer of p-type GaAs on said second layer,
   a fourth layer of p-type $Ga_{0.7}Al_{0.3}As$ over said third layer,
   a fifth layer of p-type GaAs over said fourth layer,
   flat bottomed V-shaped parallel grooves periodically etched through the fifth through second layers, said channels resulting in facing mirror-like surfaces disposed at 45° to the p-n junction created between said second and third layers, and
   electrical contacts on said first and fifth layers for providing electrical current to said p-n junctions whereby laser light emitted at any p-n junction will be reflected by said surfaces in a direction parallel to the direction of current flow.

3. The array of claim 2 including recesses in said first layer extending to said second layer, said recesses being at the feet of said 45° surfaces, and
   reflecting surfaces located in said recesses under said feet, said reflecting surfaces being alternately totally light reflecting and partially light transmitting.

4. An array of p-n junction lasers formed integrally on a common substrate and having a common p-n junction between layers of p and n type semiconducting materials, comprising;
   a plurality of sloping-sided pockets penetrating both said p and n type layers and forming a plurality of pairs of mirror-like surfaces intersecting said p-n junction at an angle of 45° to provide in said junction a plurality of lasing paths between the pairs of mirrored surfaces;
   electrodes attached to the semiconducting material opposite the respective lasing paths in said junction and operative when potentialized to induce a localized current flow across the junction in the region of each discrete lasing path to produce light emission in the junction between the paired mirror surfaces; and
   mirrors cooperatively optically coupled to each of said pairs of mirror-like surfaces to provide a plurality of cavities resonant to the light emitted by the lasing areas in said junction.

5. The array of claim 4 wherein one of said coupled mirrors is totally reflective of laser light and the other mirror is partially transmissive of said laser light.

* * * * *